United States Patent [19]

Terpstra et al.

[11] Patent Number: 6,150,224

[45] Date of Patent: Nov. 21, 2000

[54] METHOD OF MANUFACTURING A SEMICONDUCTOR DEVICE WITH A BIPOLAR TRANSISTOR

[75] Inventors: Doede Terpstra, Eindhoven; Catharina H. H. Emons, Nijmegen, both of Netherlands

[73] Assignee: U.S. Philips Corporation, New York, N.Y.

[21] Appl. No.: 09/393,944

[22] Filed: Sep. 10, 1999

[30] Foreign Application Priority Data

Sep. 11, 1998 [EP] European Pat. Off. .............. 98203054

[51] Int. Cl.$^7$ ..................... H01L 21/331; H01L 21/8222
[52] U.S. Cl. ......................... 438/309; 438/315; 438/336; 438/343; 438/365
[58] Field of Search ..................................... 438/309, 315, 438/331, 336, 337, 343, 365, 349, 368, 366

[56] References Cited

U.S. PATENT DOCUMENTS

| 5,106,767 | 4/1992 | Comfort et al. ........................ 438/365 |
| 5,656,514 | 8/1997 | Ahlgren et al. ........................ 438/320 |

FOREIGN PATENT DOCUMENTS

0378794A1  7/1990  European Pat. Off. .

OTHER PUBLICATIONS

PHN 17,066, U.S. Ser. No. 09/387,629, Filed: Aug. 31, 1999.

*Primary Examiner*—Charles Bowers
*Assistant Examiner*—Hsien-Ming Lee

*Attorney, Agent, or Firm*—Steven R. Biren

[57] ABSTRACT

The invention relates to the manufacture of a so-called differential bipolar transistor comprising a base (1A), an emitter (2) and a collector (3), the base (1A) being formed by applying a doped semiconducting layer (1) which locally borders on a monocrystalline part (3) of the semiconductor body (10) where it forms the (monocrystalline) base (1A), and which semiconducting layer (1) borders, outside said monocrystalline part, on a non-monocrystalline part (4, 8) of the semiconductor body (10) where it forms a (non-monocrystalline) connecting region (1B) of the base (1A). The non-monocrystalline part (4, 8) of the semiconductor body (10) is obtained by covering the semiconductor body (10) with a mask (20) and replacing on either side thereof a part (8) of the semiconductor body (10) by an electrically insulating region (8) and by providing this, prior to the application of the semiconducting layer (1) with a polycrystalline semiconducting layer (4). The known method, in which an aperture is etched above the collector (3) after deposition of the polycrystalline layer (4), is relatively laborious. In a method in accordance with the invention, the polycrystalline layer (4) is selectively provided on the electrically insulating region (8), in which process use is made of the mask (20) to form the electrically insulating region (8). This method is less laborious than the known method. In addition, the resultant transistors have excellent properties and their dimensions may be very small. Preferably, both in the manufacture of the insulating region (8), preferably an oxide-filled groove (8), and in the process of selectively applying the polycrystalline layer (4) to the insulating region, use is made of a deposition step followed by a chemico-mechanical polishing step.

8 Claims, 3 Drawing Sheets

METHOD OF MANUFACTURING A SEMICONDUCTOR DEVICE WITH A BIPOLAR TRANSISTOR

BACKGROUND OF THE INVENTION

The invention relates to a method of manufacturing a semiconductor device comprising a semiconductor body with a bipolar transistor including a base, an emitter and a collector, said base being formed by providing the semiconductor body with a doped semiconducting layer which locally borders on a monocrystalline part of the semiconductor body where it forms a first semiconductor region which is monocrystalline and constitutes the base of the transistor, and which semiconductive layer borders, outside said base, on a non-monocrystalline part of the semiconductor body where it forms a second semiconductor region which is not monocrystalline and which constitutes a connection region of the base, the non-monocrystalline part of the semiconductor body being obtained by covering the semiconductor body with a mask and replacing, on either side thereof, a part of the semiconductor body by an electrically insulating region, and by providing the electrically insulating region with a polycrystalline semiconducting layer before the provision of the semiconducting layer.

Such a method is known from European patent application, filed by the current applicant (PHN 17.066) under application no. 98202894.6 on Aug. 31, 1998. In said document, a description is given of a method for the manufacture of a so-called differential bipolar transistor. Such a transistor is obtained by providing a semiconducting layer on a crystalline and a non-crystalline part of the semiconductor body, which forms at said locations, respectively, a crystalline semiconductor region, the base of the transistor, and a non-crystalline semiconductor region, a connecting region of the base. The crystalline part of the semiconductor body forms the collector, and in the semiconducting layer the emitter is formed at the location of the base. The non-monocrystalline part of the semiconductor body is formed by an electrically insulating region which surrounds the collector and on which a polycrystalline semiconducting layer is situated which serves as the host layer during the provision of the semiconducting layer. The electrically insulating region is formed by a LOCOS (=Local Oxidation Of Silicon) oxide on which a polycrystalline layer is provided in which an aperture is formed at the location of the collector by means of photolithography and etching.

A drawback of the known method is that it is relatively laborious, partly because a photolithographic step followed by an etch step is necessary to form an aperture in the polycrystalline layer above the collector.

SUMMARY OF THE INVENTION

It is an object of the invention to provide a method which is less intricate and nevertheless yields transistors of at least the same quality.

To achieve this, a method in accordance with the invention is characterized in that the polycrystalline layer is selectively provided on the electrically insulating region, use being made of the mask to form the electrically insulating region. As a result, the method in accordance with the invention is much simpler than the known method. Additional photolithographic and etch steps are not necessary to (re-)expose the collector. In the selective deposition process, the use of the mask employed for forming the electrically insulating region has an important additional advantage which is connected with the following surprising realization: by applying chemical-mechanical polishing during the selective application of the polycrystalline layer, said polycrystalline layer can be provided in the same manner as the electrically insulating region, thereby making its manufacture easy. Finally, a method in accordance with the invention has the important advantage that the aperture which the polycrystalline semiconducting layer should have above the collector is formed in a self-recording manner relative to said collector. As a result, the dimensions of the transistor to be formed can be much better controlled, thus enabling, in particular, said dimensions to be very small and hence the transistor very fast.

In a preferred embodiment of a method in accordance with the invention, the polycrystalline semiconducting layer is provided onto the mask and the electrically insulating region, and the resulting structure is leveled off by means of chemical-mechanical polishing, the mask remaining buried in the polycrystalline semiconducting layer, and subsequently the polycrystalline semiconducting layer is removed to such an extent that the mask is re-exposed. Chemical-mechanical polishing (=CMP) enables a method in accordance with the invention to be carried out in a controlled manner and with excellent results. In addition, a method in accordance with the invention is made simple by applying this technique. The mask is, for example, a nitride mask which, as in the known method, can be used to form so-called LOCOS oxide which forms the electrically insulating region on either side of the collector. Re-exposing the mask can take place simultaneously with leveling off the structure by means of CMP. It can also be achieved by means of etching after the CMP treatment using an anisotropic etching technique, such as plasma etching.

In a very important embodiment of a method in accordance with the invention, the electrically insulating region is formed by making grooves in the semiconductor body on either side of the mask, providing an electrically insulating layer in the grooves and on the mask, whereafter an electrically insulating layer is provided in the grooves and on the mask, and the resultant structure is leveled off by means of chemico-mechanical polishing, the mask remaining buried in the electrically insulating layer, whereafter the electrically insulating layer is removed to such an extent that the mask is re-exposed, whereafter a part of the resultant electrically insulating region is removed, the mask remaining intact. Such a method, in which chemico-mechanical polishing can also be used to form the electrically insulating region, keeps the method simple because both the electrically insulating region and the polycrystalline layer are formed in the same manner. In addition, the formation of the electrically insulating region in this manner results in a very flat structure, thereby substantially simplifying the subsequent selective provision in a similar manner of the polycrystalline semiconducting layer, since an electrically insulating region formed by so-called LOCOS oxide, results in a structure which is not very flat, thereby hampering the chemico-mechanical process to be carried out after the provision of the polycrystalline layer. By selectively removing a small part of the electrically insulating region formed with respect to the mask, the profile in the surface necessary for the preferred embodiment is achieved. This profile can be obtained by forming a recess in the structure using a wet-chemical etchant which is selective with respect to electrically insulating material. Also in this variant, the mask can be exposed by means of the CMP step, but also by a separate (anisotropic) etch step after the structure has been leveled off by means of CMP, the mask still being buried in the insulating layer. If the anisotropic etch step is carried out using an etchant which etches the electrically insulating material in a selective manner with respect to the mask, then the additional advantage is obtained that no separate etch step is necessary to provide the structure, after exposure of the mask, with the profile necessary to apply the polycrystalline layer. Also in this case, a suitable technique for anisotropic (selective) etching is the plasma-etched technique. Finally, partly because of the absence of LOCOS oxide, the method of this variant can very suitably be used to manufacture transistors having very small dimensions.

After the formation of the electrically insulating region and the formation of the polycrystalline semiconducting layer thereon, the mask used in this operation is preferably removed. This can be achieved in a simple manner by immersing the mask in an etchant which is selective with respect to the mask. As a result, the collector is re-exposed, and the semiconducting layer can be provided. Subsequently, the emitter can be formed so as to border on the base.

Preferably, silicon dioxide is used as the material for the electrically insulating region, and silicon nitride is used as the material for the mask. These materials can be readily selectively removed relative to each other and relative to silicon. These materials can also very suitably be used in combination with the chemico-mechanical polishing technique.

These and other aspects of the invention will be apparent from and elucidated with reference to the embodiments described hereinafter.

Figure 1:
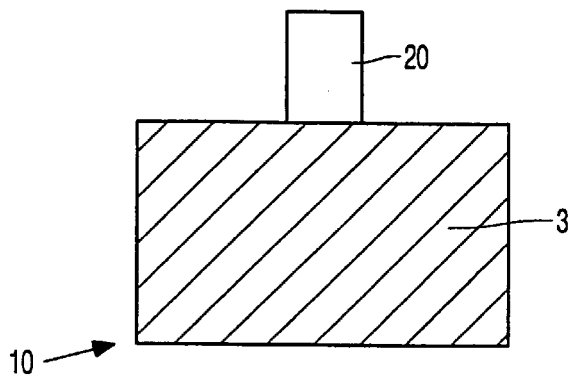
FIGS. 1 through 10 are diagrammatic, cross-sectional views, at right angles to the thickness direction, of a semiconductor device with a bipolar transistor, at successive stages in the manufacture using a method in accordance with the invention.
Figure 2:
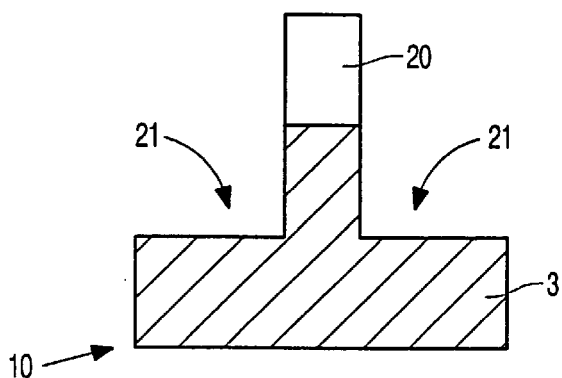
Figure 3:
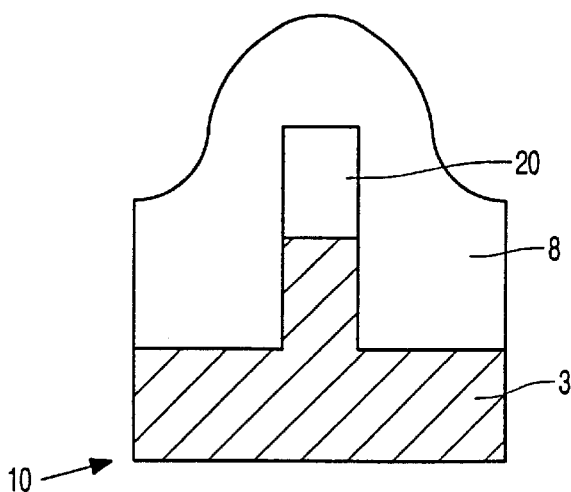
Figure 4:
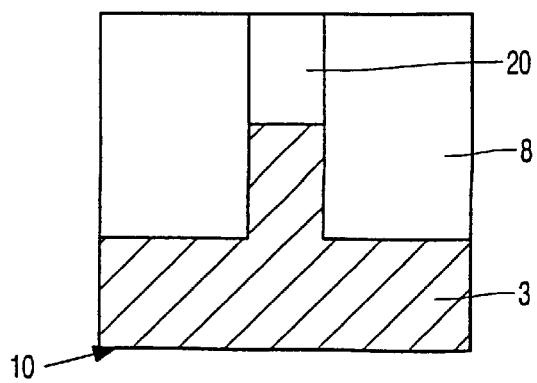
Figure 5:
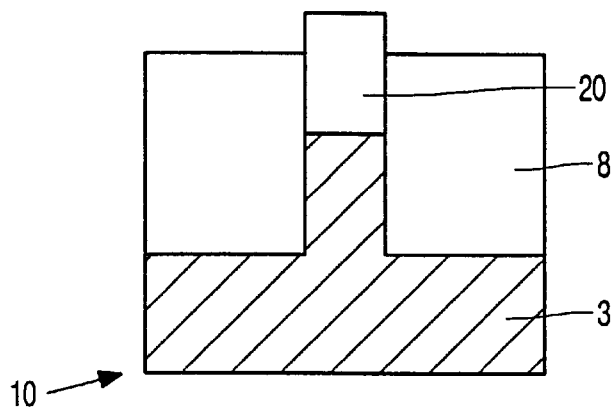
Figure 6:
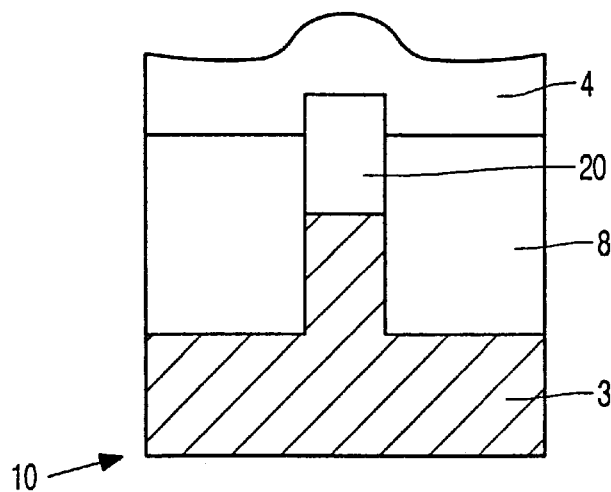
Figure 7:
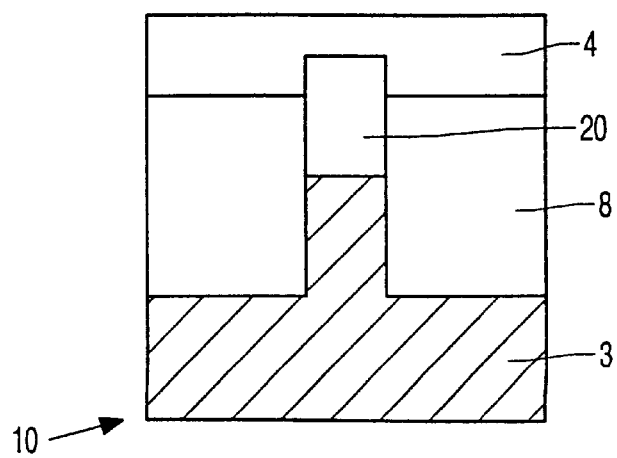
Figure 8:
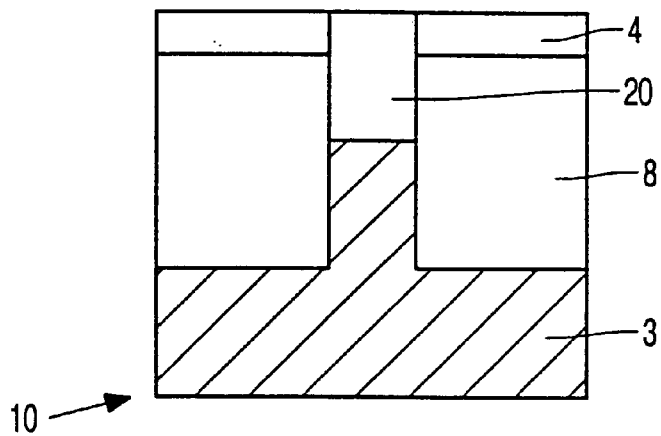
Figure 9:
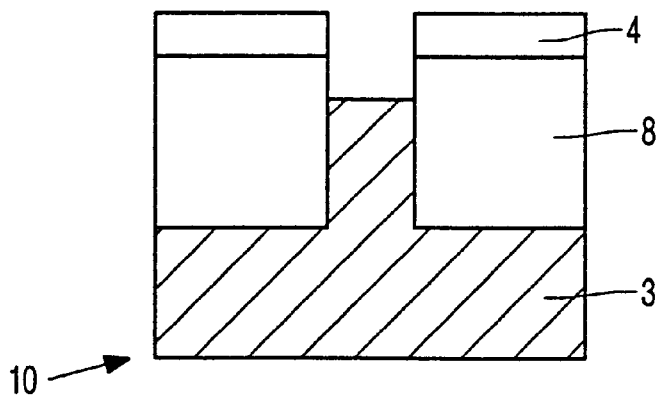

The Figures are diagrammatic and not drawn to scale, in particular the dimensions in the thickness direction being exaggerated for clarity. Semiconductor regions of the same conductivity type are generally hatched in the same direction. Like reference numerals refer to like regions whenever possible.

DESCRIPTION OF THE PREFERRED EMBODIMENTS

Figure 10:
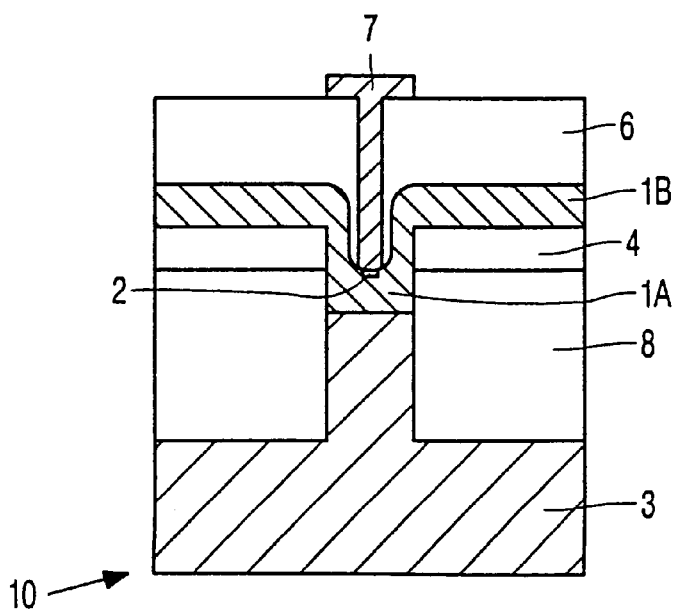

FIGS. 1 through 10 are diagrammatic, cross-sectional views, at right angles to the thickness direction, of a semiconductor device with a bipolar transistor, at successive stages in the manufacture using a method in accordance with the invention. FIG. 10 is a diagrammatic, cross-sectional view, at right angles to the thickness direction, of the finished device comprising a bipolar transistor. The semiconductor body 10 comprises (not shown in the drawing) a monocrystalline substrate of $p^+$-type silicon covered with a 1 $\mu$m thick monocrystalline epitaxial layer 3 of n-type silicon with a doping concentration of $1 \times 10^{16}$ at/cm$^3$ which forms a collector 3 of the transistor. The epitaxial layer 3 accommodates a 0.3 $\mu$m recessed insulation region 8 which, in this case, includes silicon dioxide and surrounds the collector 3. On the epitaxial layer there is provided a polycrystalline, p-type silicon layer 4 having a thickness of 50 nm and a doping concentration of, in this example, $1 \times 10^{20}$ at/cm$^3$. On said silicon layer and on the collector 3, there is provided an, in this case 150 nm thick, p-type semiconducting layer 1 which, in this case contains SiGe with 20 at. % germanium. The part 1A of the semiconducting layer 1 bordering on the collector 3 is monocrystalline and forms a base 1A of the transistor. The remaining part 1B of the semiconducting layer 1 is polycrystalline, borders on the polycrystalline layer 4 and forms a connecting region 1B of the base 1A of the transistor. At the location of the base 1A, the doping concentration is $1 \times 10^{19}$ at/cm$^3$, at the location of the connecting region 1B, the doping concentration is higher and amounts to $1 \times 10^{20}$ at/cm$^3$. Above the semiconducting layer 1, there is a 0.3 $\mu$m thick insulating layer of silicon dioxide having a recessed portion above the base 1A, which is filled with an emitter connection 7 of n-type polycrystalline silicon whose doping concentration is approximately $10^{21}$ at/cm$^3$. Below this, there is an emitter 2 of the transistor which is recessed in the base 1A which is of the n-conductivity type, has a thickness of 40 nm and a doping concentration of approximately $10^{20}$ at/cm$^3$. The device further includes (not shown in the Figure) electrical connections of the connecting region 11 of the emitter 2, of the connecting region 1B of the base 1A and of a connecting region (not shown either in the drawing) of the collector 3. The width of the part of the semiconductor body shown in the drawing is several micrometers, the collector 3 and the base 1A have a width of approximately 1 $\mu$m, and the width of the emitter 2 and the emitter connection 7 is approximately 0.5 $\mu$m.

The device of this example is manufactured as will be described hereinbelow using a method in accordance with the invention. A p-type silicon substrate (not shown in the drawing) is first provided with an epitaxial n-type silicon layer 3 (see FIG. 1). This n-type silicon layer is provided with a mask 20, which in this case is formed from a 200 nm thick silicon nitride layer 20 by means of photolithography and etching. By means of plasma etching (see FIG. 2), 0.3 $\mu$m deep grooves 21 are formed in the semiconductor body 10 on either side of the mask 20. Subsequently, (see FIG. 3) a 1 $\mu$m thick layer 8 of silicon dioxide is provided on the surface of the semiconductor body 10 by means of LPCVD (=Low Pressure Chemical Vapor Deposition). Next, (see FIG. 4) the oxide layer 8 is subjected to a chemico-mechanical polishing so as to ensure that the resultant structure is flat and the surface of the (remaining part) of the mask 20 is re-exposed. In this process, use is made of a "slurry" of silicon dioxide particles and potassium hydroxide. A suitable slurry is, for example, ss12 by Cabbot. Subsequently, (see FIG. 5) a part of the insulation oxide 8 is removed again by means of an etchant comprising hydrogen fluoride, in which process the mask 20 is not attached and projects 0.1 $\mu$m above the surface of the semiconductor body 10 after the etch process.

In accordance with the invention, the electrically insulating region 8 is subsequently selectively provided with a polycrystalline semiconducting layer 4, in which process use is made of the mask 20 which was used to form the electrically insulating region 8. As a result, the method in accordance with the invention is much simpler than the known method. First of all, additional photolithography and etching, as in the known method, are not necessary to remove (again) the polycrystalline layer 1 above the collector 3. By virtue of the use of the mask 20 to selectively provide the insulating region 8 with the polycrystalline layer 4, a chemico-mechanical polishing technique becomes very suitable to obtain the desired result. Another important advantage of a method in accordance with the invention is that the aperture in the polycrystalline semiconducting layer 4 above the collector 3 is formed in a self-recording manner relative to said collector 3. As a result, the dimensions of the transistor to be formed can be controlled much better, thus enabling very small and very fast transistors to be achieved.

In this example, (see FIG. 6) the surface of the semiconductor body 10 is first provided with a several tens of micrometers thick polycrystalline semiconducting layer 4, in this case by means of LPCVD from a gas mixture containing silane and hydrogen. Subsequently, (see FIG. 7) the polycrystalline layer 4 is removed by means of chemico-mechanical polishing to such an extent the resultant structure is flat. At this stage, the mask 20 is still buried in the polycrystalline layer 4. In this process, use is made of the same slurry as in the above-described chemico-mechanical polishing step. It is alternatively possible, however, to use a different slurry which is more specially developed for etching polycrystalline silicon. Next, (see FIG. 8) an anisotropic etch technique, such as plasma etching, is used to etch back the polycrystalline layer 4 until the mask 20 is exposed. In this manner, the insulating region 8 is provided, in a selective and self-recording manner, with the polycrystalline semiconducting layer 4.

Subsequently, (see FIG. 9) the mask 20 is removed by means of etching, in this case by means of warm phosphoric acid, without the polycrystalline layer 4 and the collector 3 being attacked. The resultant structure is used to continue the manufacture of the transistor. The further content of the method used in this example can be summarized as follows (see FIG. 10): the application of the semiconducting layer 1, the provision above the base 1A of a further mask of silicon nitride, depositing an insulating layer 6 on said mask, followed by planarization of the structure by means of chemico-mechanical polishing, the removal of the further mask and providing polycrystalline silicon 7 in the resultant aperture, thus forming the emitter 2, which itself forms a connecting region for the emitter 2. Furthermore, the base 1A and the collector 3 are provided (via their connecting region) with connecting conductors. For further particularities regarding this part of the manufacture of the transistor, reference is made to the above-mentioned European patent application (PHN 16.077).

The invention is not limited to the above examples, and within the scope of the invention many modifications and variations are possible to those skilled in the art. For example, other compositions and thicknesses for the different (semiconductor) regions or layers can be selected. It is also possible to use other deposition techniques, such as MBE (=Molecular Beam Epitaxy) and CVD (=Chemical Vapor Deposition). It is also possible to modify the manufacture in various ways.

Also the geometry and dimensions of the various regions of the transistor may be chosen so as to be different.

A device in accordance with the invention can also be a more complex device than a single bipolar transistor. The device may comprise a number of different active or passive components. The transistor may also form part of a BI(C) MOS (=BIpolar (Complementary) Metal Oxide Semiconductor) IC.

What is claimed is:

1. A method of manufacturing a semiconductor device comprising a semiconductor body with a bipolar transistor including a base, an emitter and a collector, said base being formed by providing the semiconductor body with a doped semiconducting layer which locally borders on a monocrystalline part of the semiconductor body where it forms a first semiconductor region which is monocrystalline and constitutes the base of the transistor, and which semiconductive layer borders, outside said base, on a non-monocrystalline part of the semiconductor body where it forms a second semiconductor region which is not monocrystalline and which constitutes a connection region of the base, the non-monocrystalline part of the semiconductor body being obtained by covering the semiconductor body with a mask and replacing, on either side thereof, a part of the semiconductor body by an electrically insulating region, and by providing the electrically insulating region with a polycrystalline semiconducting layer before the provision of the semiconducting layer, characterized in that the polycrystalline layer (4) is selectively provided on the electrically insulating region (8), the mask (20) is used to form the electrically insulating region (8), the polycrystalline semiconducting layer (4) is provided onto the mask (20) and the electrically insulating region (8), and the resulting structure is leveled off by means of chemical-mechanical polishing, the mask (20) remaining buried in the polycrystalline semiconducting layer (4), and subsequently the polycrystalline semiconducting layer (4) is removed to such an extent that the mask (20) is re-exposed.

2. A method as claimed in claim 1, characterized in that the mask (20) is re-exposed by means of etching the polycrystalline semiconducting layer.

3. A method as claimed in claim 1, characterized in that the electrically insulating region (8) is formed by making grooves (21) in the semiconductor body (10) on either side of the mask (20), providing an electrically insulating layer (8) in the grooves (21) and on the mask (20), whereafter an electrically insulating layer (8) is provided in the grooves (21) and on the mask (20), and the resultant structure is leveled off by means of chemico-mechanical polishing, the mask (20) remaining buried in the electrically insulating layer (8), whereafter the electrically insulating layer (8) is removed to such an extent that the mask (20) is re-exposed, whereafter a part of the resultant electrically insulating region (8) is removed, the mask (20) remaining intact.

4. A method as claimed in claim 3, characterized in that the mask (20) is exposed by means of chemico-mechanical polishing, and the removal of a part of the electrically insulating region (8) formed takes place by means of etching, in which process the mask (20) remains intact.

5. A method as claimed in claim 3, characterized in that both exposing the mask (20) and removing a part of the electrically insulating region (8) formed, the mask (20) remaining intact, takes place by means of etching.

6. A method as claimed in claim 1, characterized in that after the formation of the electrically insulating region (8) and after the provision of the polycrystalline semiconducting layer (4), the mask (20) is removed, whereafter the emitter (2) is formed in the surface of the semiconducting layer (1) at the location of the base (1A).

7. A method as claimed in claim 1, characterized in that silicon dioxide is used as the material for the electrically insulating region (8) and silicon nitride is used as the material for the mask (20).

8. A semiconductor device comprising a bipolar transistor obtained using a method as claimed in claim 1.

* * * * *